(12) United States Patent
De Bosscher et al.

(10) Patent No.: US 7,563,488 B2
(45) Date of Patent: Jul. 21, 2009

(54) PROCESS FOR THE MANUFACTURING OF A SPUTTER TARGET

(75) Inventors: Wilmert De Bosscher, Drongen (BE); Hilde Delrue, Aalst (BE); Johan Vanderstraeten, Gavere (BE)

(73) Assignee: NV Bekaert SA, Zwevegem (BE)

( * ) Notice: Subject to any disclaimer, the term of this patent is extended or adjusted under 35 U.S.C. 154(b) by 916 days.

(21) Appl. No.: 10/486,650

(22) PCT Filed: Jul. 10, 2002

(86) PCT No.: PCT/EP02/07695

§ 371 (c)(1),
(2), (4) Date: Mar. 11, 2004

(87) PCT Pub. No.: WO03/016584

PCT Pub. Date: Feb. 27, 2003

(65) Prior Publication Data

US 2005/0118339 A1    Jun. 2, 2005

(30) Foreign Application Priority Data

Aug. 13, 2001    (EP)    ................................. 01203086
Aug. 13, 2001    (EP)    ................................. 01203091

(51) Int. Cl.
*C23C 14/34*    (2006.01)
*C23C 16/00*    (2006.01)

(52) U.S. Cl. ........................ 427/446; 427/449; 427/453; 427/454; 427/455; 427/456; 148/559; 148/564; 148/705; 148/714; 228/196; 204/298.12; 204/298.13

(58) Field of Classification Search ............ 204/298.12, 204/298.13; 148/559, 564, 705, 714; 427/446, 427/449, 453, 454, 455, 456; 228/196
See application file for complete search history.

(56) References Cited

U.S. PATENT DOCUMENTS

| | | | |
|---|---|---|---|
| 5,354,446 A | | 10/1994 | Kida et al. |
| 5,593,082 A | * | 1/1997 | Ivanov et al. ............. 228/122.1 |
| 6,030,514 A | * | 2/2000 | Dunlop et al. .......... 204/298.12 |
| 6,331,234 B1 | * | 12/2001 | Kardokus et al. ....... 204/298.13 |

FOREIGN PATENT DOCUMENTS

| | | | |
|---|---|---|---|
| DE | 3318828 A1 | * | 11/1984 |
| JP | 63-290273 A | | 11/1988 |
| JP | 07-228967 | * | 8/1995 |
| JP | 7-228967 A | | 8/1995 |
| JP | 7-331426 A | | 12/1995 |

OTHER PUBLICATIONS

Machine Translation of JP 07-228967. Dated Aug. 1995.*
U.S. Appl. No. 10/486,649, filed Mar. 11, 2004, De Bosscher et al.

* cited by examiner

*Primary Examiner*—Rodney G McDonald
(74) *Attorney, Agent, or Firm*—Foley & Lardner LLP

(57) ABSTRACT

The invention relates to a process for manufacturing a sputter target. The process comprises the steps of—providing a target holder (12); —applying an intermediate layer (14) on said target holder; —applying a top layer (16) on top of said intermediate layer; said top layer comprising a material having a melting point which is substantially higher than the melting point of said target material; —heating the target holder coated with said intermediate layer and said top layer.

20 Claims, 1 Drawing Sheet

PROCESS FOR THE MANUFACTURING OF A SPUTTER TARGET

FIELD OF THE INVENTION

The invention relates to a process for manufacturing a sputter target.

BACKGROUND OF THE INVENTION

A target assembly conventionally comprises a target holder, such as a plate or tube, carrying a layer of a target material applied to its outer surface.

Thermal spraying techniques are often employed to apply the target material onto the target holder. In some other cases, the metal target material is cast on a target holder.

Sprayed targets as for example zinc targets show the disadvantage of forming highly porous structures.

Zinc targets obtained by casting techniques are characterised by a somewhat higher density, but they have the disadvantage that the bonding between individual grains may be poor.

SUMMARY OF THE INVENTION

It is an object of the present invention to provide a process for the manufacturing of sputter targets.

It is another object to provide a process with a lot of flexibility for example with respect to the starting material used as target material or with respect to the technique used for the application of this target material.

It is a further object of the invention to provide a process which produces targets characterised by a high density.

Furthermore, it is an object of the invention to provide a process which produces targets characterised by a good bonding between the target holder and the target material and between the individual particles of the target material.

The process can also be used to refine or purify the target material to a high degree of purity.

It is a further object of the present invention to provide a process of applying a target material on a target holder at low temperatures and/or at low pressure.

According to a first aspect of the present invention a process for the manufacturing of a sputter target is provided.

The process comprises the steps of:
providing a target holder;
applying an intermediate layer on said target holder;
applying a top layer on top of said intermediate layer; said top layer comprising a material having a melting point which is substantially higher than the melting point of said intermediate layer;
heating the target holder coated with the intermediate layer and the top layer.

The process may further comprise the step of removing the top layer.

The top layer is holding the intermediate layer on the target holder during the heating, thereby preventing that the intermediate layer is flowing away from the target holder. Therefore, the target is heated to a temperature lower than the melting point of the top layer.

Furthermore, the top layer may function as a protective layer of the intermediate layer avoiding for example oxidation of the intermediate layer or avoiding contamination of the intermediate layer. In case the top layer is functioning as a protective layer, it can be preferred that the top layer is only removed shortly before the sputter target is used in the sputter process, for example at the customer's place.

Possibly, the process further comprises the application of a release layer between the application of the intermediate layer and the top layer.

The function of such a release layer is to facilitate the removal of the top layer and/or to avoid diffusion between the intermediate layer and the top layer.

Either the intermediate layer or the top layer may function as target material.

The target holder serves for supporting and cooling the sputter target. It can be a plate or tube.

In a preferred embodiment, the target holder comprises a stainless steel tube.

The intermediate layer may comprise any material as for example a metal, a metal alloy or a metal oxide.

The intermediate layer comprises for example zinc or a zinc alloy, such as zinc-tin alloy; titanium oxide; indium or indium oxide, such as indium tin oxide (ITO).

The intermediate layer may function as target material. Alternatively, the intermediate layer forms an adhesion layer between the target holder and the top layer, functioning as target material.

The intermediate layer can be applied on the target holder by different techniques, as for example by spraying such as thermal spraying or dipping.

Alternatively, the target material can be coiled around the target holder. The material to be coiled comprises for example one or more metal foils, one or more metal strips or one or more metal wires. The coiling of a combination of metal foils, metal strips and/or metal wires is also possible.

Also bunch winding of wires is a suitable technique to apply the intermediate layer. By bunch winding wires with the same or with a different composition can be coiled around the target holder. It can be preferred that the wires have a flat or rectangular cross-section. For a person skilled in the art it is clear that bunch winding can be combined with the coiling of other material such as foils, strips or wires or can be combined with the application of powder.

As wires also hollow wires can be used. These wires may be filled with another material such as metal powder. The metal powder may for example comprise one or more doping elements.

A further method to apply the intermediate layer on the target holder is by applying segments such as tiles, rings, connecting pieces or surfaces on the target holder. Preferably, the segments have an appropriate geometry so that the different segments fit well on the target holder and/or on the adjacent segments.

The application of foils, strips, wires or segments is for example very suitable in case expensive materials are applied because the loss of material is reduced to a minimum by this application technique.

The intermediate layer may comprise a single layer or a multiplicity of layers.

In case a multiplicity of layers is applied, the successive layers may comprise the same material, i.e. the same metal, metal alloy or metal oxide. Alternatively, successive layers may comprise different materials. Successive layers can be applied by different techniques, for example a first layer may be applied by spraying, while a second layer may be applied by coiling foil or wire around the target holder on which the first layer is applied.

The top layer may comprise any material that has a relatively high melting point. The top layer comprises for example a metal, a metal alloy or a metal oxide.

Preferably, the melting point of the top layer is substantially higher than the melting point of the intermediate layer. More preferably, the difference in melting point between the intermediate layer and the top layer is at least 100° C. Most preferably, the difference in melting point between the intermediate layer and the top layer is at least 200° C.

Another requirement of the top layer is that it forms a closed layer which covers the intermediate layer completely and which protects the intermediate layer from the surroundings.

In a preferred embodiment, the top layer is a stainless steel layer which is sprayed on top of the intermediate layer.

Other suitable top layers comprise high melting metals or metal alloys such as Mo or W or alloys thereof.

In principle the top layer can be applied by any technique known in the art which forms a closed layer. Preferred techniques comprise spraying, such as thermal spraying, or dipping.

For the heating step in principle every heating technique whereby the target assembly is heated to the desired temperature is suitable. The top layer prevents the target material of flowing away from the target holder and/or may form a protective layer for the target material.

A preferred heating technique comprises induction heating. Also resistance heating, conduction heating, electrical discharge heating and radiation heating can be considered.

Preferably, the target is only heated locally for example by using a zone heating method.

In such a zone heating method, an induction heating coil surrounds the target assembly in an annular fashion and is moved relative to the target assembly in the axial direction thereof.

Alternatively, the target assembly is moved relative to a fixed heating coil.

It is preferred that the target assembly is rotated during the heating.

The target can be placed either horizontally or vertically during the heating step. In most cases, a vertical position is preferred. A horizontal position of the target may favour the homogeneous mixing of the intermediate layer or of the different components of the intermediate layer during the heating step; a vertical position of the target may be preferred in case a slow solidifying is desired or in case the heating step is applied to purify the intermediate layer as described below in more detail.

It can be preferred that the position of the target is horizontal during a first heating step and that the target is placed in a vertical position during the subsequent heating step or steps.

During or after the heating step, the target assembly can be cooled for example by means of circulating water. The target assembly may be cooled from the inside, from the outside or from the inside and the outside of the target assembly.

According to a first aspect it can be the object of the heating step to melt at least one component of the intermediate layer.

In this case, the target assembly is heated to a temperature equal to or higher than the melting point of the intermediate layer or to a temperature higher than the melting point of at least one component of the intermediate layer. Preferably, the target assembly is heated to a temperature lower than the melting point of the top layer. After the heating step, the target assembly can be cooled to obtain the desired properties of the intermediate layer.

In case the target is heated to a temperature equal to or higher than the melting point of one component but lower than the melting point of one or more other components of the intermediate layer, a mechanical embedding of the one component in the other component or components can be obtained. This is for example the case if an intermediate layer comprising zinc and titanium oxide, such as titanium dioxide or sub-stoichiometric titanium dioxide, is heated to a temperature higher than the melting point of zinc.

Due to the heating and the subsequent cooling, a recrystallization of the material of the intermediate layer can be obtained. By recrystallization substantially uniform grains can be obtained.

The way of heating and the way of cooling have a direct influence on the melted and recrystallized material, as for example on the lattice structure, the grain properties such as grain size, grain orientation and grain distribution.

The orientation of the grains may be varied from perpendicular or substantially perpendicular to the longitudinal axis of the target holder to longitudinal or substantially longitudinal to the longitudinal axis of the target holder.

By performing the heating and/or the subsequent cooling longitudinally, the grains are oriented longitudinal or substantially longitudinal with the longitudinal axis of the target holder.

As described below, the heating step could be repeated for example by traversing a heating coil more than once over the length of the target assembly. In such case grains oriented perpendicular or substantially perpendicular to the longitudinal axis of the target holder can be obtained.

The density of the material of the intermediate layer may be increased after the heating and cooling step is performed.

Preferably, the intermediate layer has a relative density higher than 92%, more preferably the relative density is higher than 95% or even higher than 98%, for example 99%.

The relative density is defined as follows:

$$\text{Relative density } (\%) = \left(\frac{\text{Bulk density}}{\text{True density}}\right) * 100$$

The bulk density (g/cm$^3$) is the experimental density calculated from the size and the weight of an actually prepared material, and the true density is the theoretical density of the material.

According to a second aspect it can be the object to obtain a diffusion between two or more components or between two or more layers. In such cases it is not necessary or not desired to melt the intermediate layer.

To realise this object, the target is heated to a temperature that allows to obtain such diffusion. Generally, this temperature is lower than the melting point of the intermediate layer and/or lower than the melting point of the top layer.

A diffusion can for example be obtained between two different materials or components, or between two different layers, for example between the target holder and the intermediate layer and/or between the intermediate layer and the top layer. Also a diffusion between the target holder, the intermediate layer and the top layer can be obtained.

A diffusion between two different materials may for example be obtained in an embodiment where two different types of wires, foils or strips coiled around the target holder and where the target assembly is heated to a temperature that allows a diffusion between the different wires, foils or strips.

A preferred embodiment comprises a zinc-tin target obtained by diffusion of zinc wires and tin wires or by diffusion of zinc tiles and tin tiles. In this way tin can be added to the target material to an amount that can not be reached by another method of applying zinc-tin as target material. Also a distribution of zinc and tin that could normally not be reached can be obtained, as for example zinc particles embedded in tin.

A major advantage of the process of manufacturing metal targets according to the present invention is that it concerns a process with a lot of flexibility for example with respect to the starting material used as intermediate layer (sprayed material, powder, wires, foils, segments, . . . ) or with respect to the technique used for the application of the intermediate layer (spraying, dipping, coiling, . . . ).

Another advantage of the process according to the present invention is the flexibility of the process to influence the properties of the target material, for example by varying the heating and cooling step and/or by the application technique of the intermediate layer and/or the top layer. It is clear, that the crystal lattice, the grain properties such as grain size, grain distribution and grain orientation and the density of the target material are determined by the heating and/or the cooling step and/or by the application technique of the intermediate layer and/or the top layer. The heating step may be tuned in temperature, time, location and/or profile in order to obtain the desired characteristics.

Still a further advantage of the process of manufacturing a target according to the present invention is that the target material can be applied on the target holder at low temperatures and/or at low pressure.

A target manufactured by the process according to the present invention is furthermore characterised by a good bonding between the individual grains.

Due to the heating, a diffusion layer may be created between the target holder and the intermediate layer.

The method of heating can also be used to refine or purify the material of the intermediate layer.

During the heating, a melting zone, produced by means of an induction heating coil, traverses the entire length of the target assembly as the coil moves from the bottom to the top of the target assembly. Gases and impurities are dissolved in the melting zone and are moving up together with the moving of the melting zone.

The purity of the target material can further be improved by vibrating the target assembly during the heating and/or cooling step or by applying ultrasonic waves on the target assembly.

If desired, the heating step could be repeated by traversing the induction heating coil more than once over the length of the target assembly.

After the heating step is performed, the top layer is preferably removed for example by a mechanical operation, such as a machining operation. Preferably, after the top layer is removed, the surface of the target material is subjected to a polishing operation.

In order to facilitate the removal of the top layer, it can be preferred that a release layer is applied between the intermediate layer and the top layer. A release layer comprises for example a paint or a metal oxide or combinations thereof. Suitable metal oxides are zirconium oxide or aluminium oxide.

The release layer may for example avoid that a diffusion layer is formed between the intermediate layer and the top layer or may facilitate the removal of the top layer shortly before the sputter process for example at the customer's place.

The targets manufactured by the process disclosed by this invention are suitable in any sputter process as for example metallic sputter processes or reactive sputter processes. The metal atoms sputtered from the target react thereby with reactive gases such as oxygen or mixtures of oxygen with other gases such as nitrogen, argon or helium, to form for example a metal oxide that is deposited on a particular substrate.

Targets according to the present invention can be easily recycled and/or reused.

For this purpose, the profile of the used target is measured and in a next step, new target material is applied to compensate for the regional losses from consumption.

The targets according to the present invention are therefore economically advantageous.

BRIEF DESCRIPTION OF THE DRAWINGS

The invention will now be described into more detail with reference to the accompanying drawings wherein.

DESCRIPTION OF THE PREFERRED EMBODIMENTS OF THE INVENTION

Figure 1:
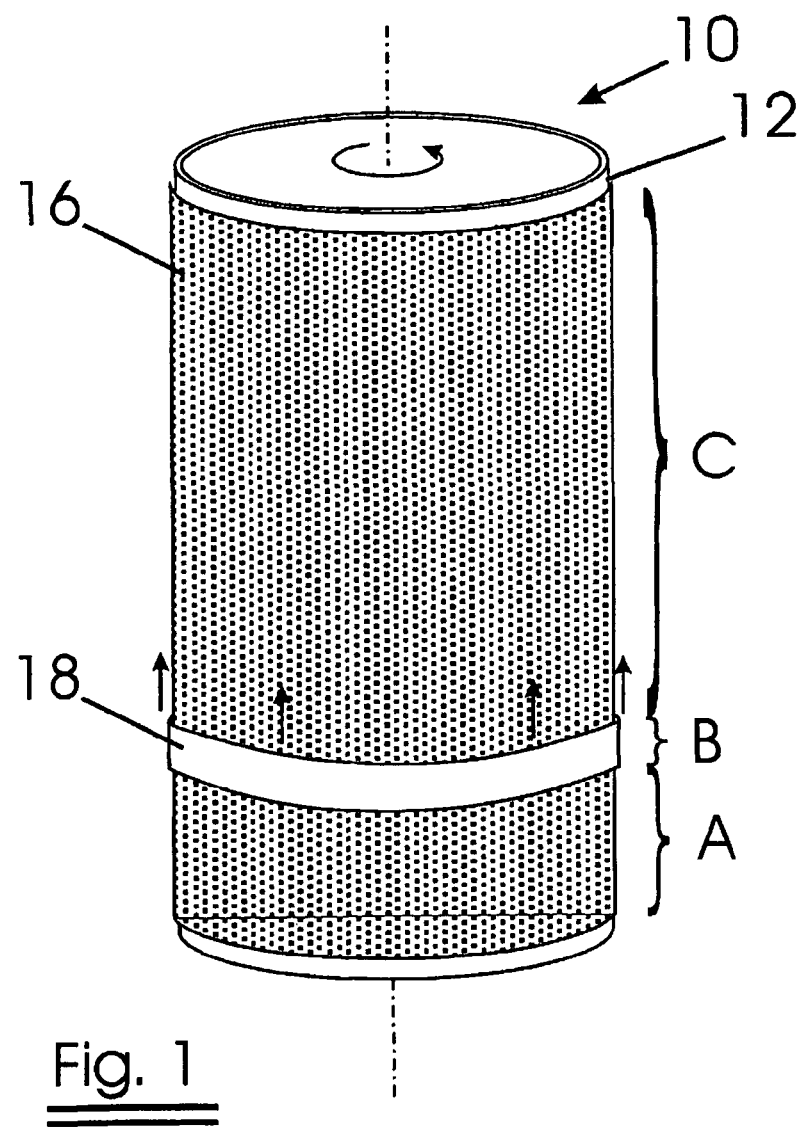
FIG. 1 shows the manufacturing process according to the present invention.
Figure 2:
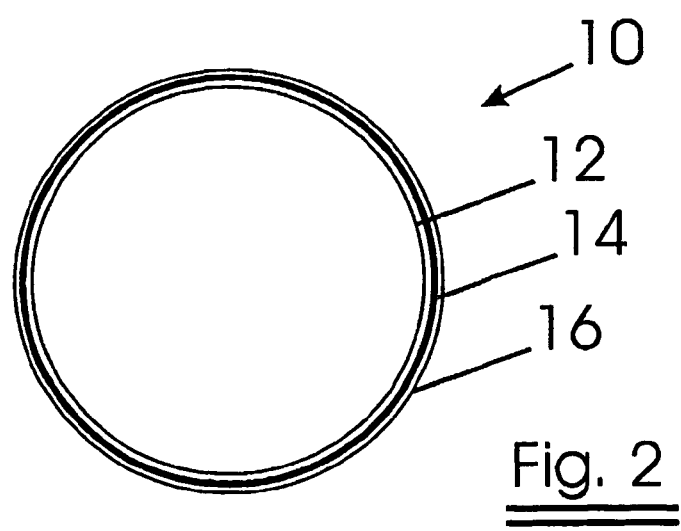
FIG. 2 shows the cross-section of a sputter target.

Referring to FIG. 1, the manufacturing process of a target according to the present invention is explained. FIG. 2 shows the cross-section of a sputter target according to the present invention.

In a first step a target assembly 10 is manufactured as follows: An intermediate layer 14 comprising zinc is sprayed on a stainless steel tube 12. The sprayed zinc layer has a density of about 91%.

The zinc layer will function as target material.

Possibly, the zinc layer comprises one or more doping elements such as

Al, Bi, Ce, Gd, Nb, Si, Ti, V, Y, Zr, Sn, Sb. The doping element or elements can be added to the target material in an easy way, for example by adding powder.

Upon the zinc layer, a top layer 16 of stainless steel is applied by spraying.

The top layer 16 surrounds the intermediate layer 14 completely.

An induction heating coil 18 is disposed around the target assembly so that a molten zone B is created.

It is preferred that the target assembly is rotated around its axis during the heating to obtain a more homogeneous heating.

During zone heating the target assembly comprises three distinct zones, zones A, B and C.

Zone A represents a melted area, zone B represents an area being melted and zone C represents an unmelted, to be melted area. Preferably, the target assembly is placed vertically and the induction coil surrounding the target assembly is moved upwardly relative to the target assembly in the axial direction thereof.

As the induction coil traverses over the target assembly, zone C melts and is transformed into zone B. As the induction coil moves further over the target assembly, zone B solidifies, thereby becoming zone A. As zone B gradually moves upwardly, zone A increases in size whereas zone C decreases in size until target assembly can be considered to consists entirely of zone A.

During zone heating the target assembly, and more particularly the intermediate layer undergoes various changes.

Due to the heating and subsequent cooling, the intermediate layer is recrystallized. The structure of the recrystallized intermediate layer comprises substantially uniform grains.

The impurities of the intermediate layer are moving upwardly together with the induction coil, resulting in a higher purity of the zone A compared with zone C.

Also voids and surface imperfections are removed.

The heated and cooled material of the intermediate layer of zone A has a density higher than 92%, for example higher than 98%.

The high density and the good bonding between the individual metal grains of a zinc targets obtained by the process according to the present invention are major advantages in comparison with the prior art targets. For example, zinc targets obtained by spraying or casting techniques are characterised by a lower density and/or a poor bonding between individual grains.

The low density and/or the poor bonding have a negative influence on the sputter process. Due to their high porosity and poor bonding between the zinc grains, already after a short sputter time, big cavities are created between individual zinc grains. As a consequence zinc dust particles fall from the target, thereby disturbing the sputter process and polluting for example the surfaces to be coated.

Another advantage of a target obtained by the process according to the present invention in comparison with prior art targets, for example targets obtained by casting, is the good adhesion of the target material to the target holder.

The invention claimed is:

1. A process for manufacturing a sputter target, said process comprising the steps of:
   providing a target holder;
   applying an intermediate layer comprising at least one component on said target holder;
   applying a top layer on top of said intermediate layer, said top layer comprising a material having a melting point which is substantially higher than the melting point of said intermediate layer;
   heating the target holder coated with said intermediate layer and said top layer to a temperature which is equal to or higher than the melting point of the at least one component of the intermediate layer; and
   removing the top layer.

2. A process for manufacturing a sputter target, said process comprising the steps of:
   providing a target holder;
   applying an intermediate layer on said target holder;
   applying a top layer on top of said intermediate layer, said top layer comprising a material having a melting point which is substantially higher than the melting point of said intermediate layer; and
   heating the target holder coated with said intermediate layer and said top layer,
   wherein said process further comprises the step of applying a release layer between said intermediate layer and said top layer.

3. A process according to claim 1, wherein said target holder is a plate.

4. A process according to claim 1, wherein said target holder is a tube.

5. A process according to claim 4, wherein said target holder is a stainless steel tube.

6. A process according to claim 1, wherein said intermediate layer comprises a metal, a metal alloy or a metal oxide.

7. A process according to claim 1, wherein said intermediate layer is applied by spraying or dipping.

8. A process according to claim 1, wherein said intermediate layer is applied by coiling at least one wire, strip or foil around said target holder or by applying segments on said target holder.

9. A process according to claim 1, wherein said intermediate layer comprises sprayed zinc or a sprayed zinc alloy.

10. A process according to claim 1, wherein said material of the top layer comprises a metal, a metal alloy or a metal oxide.

11. A process according to claim 1, wherein said top layer is applied by spraying or dipping.

12. A process according to claim 1,
    wherein said top layer is a stainless steel layer which is sprayed on top of the intermediate layer.

13. A process according to claim 2, wherein said release layer comprises a metal oxide.

14. A process according to claim 1, wherein the heating comprises heating to a temperature that allows diffusion between two or more components of the intermediate layer.

15. A process according to claim 1, wherein the heating comprises induction heating.

16. A process according to claim 1, wherein the heating comprises heating the target holder coated with said intermediate layer and said top layer such that the at least one component of the intermediate layer is melted and the top layer holds the intermediate layer so as to prevent any portion of the intermediate layer from flowing away from the target holder when the at least one component of the intermediate layer is melted.

17. A process according to claim 1, wherein the heating comprises heating to a temperature which is equal to or higher than the melting point of the at least one component of the intermediate layer but is less than a melting point of the top layer.

18. A process according to claim 1, wherein the heating comprises heating to a temperature such that the at least one component of the intermediate layer is melted but the top layer remains solid.

19. A process according to claim 1, wherein the intermediate layer remains on the target holder after the top layer is removed.

20. A process according to claim 1, wherein the step of applying the top layer on top of the intermediate layer comprises applying the top layer directly on top of the intermediate layer.

* * * * *